United States Patent [19]
Smith et al.

[11] Patent Number: 5,828,455
[45] Date of Patent: Oct. 27, 1998

[54] APPARATUS, METHOD OF MEASUREMENT, AND METHOD OF DATA ANALYSIS FOR CORRECTION OF OPTICAL SYSTEM

[75] Inventors: Adlai H. Smith; Bruce B. McArthur, both of San Diego; Robert O. Hunter, Jr., Rancho Santa Fe, all of Calif.

[73] Assignee: Litel Instruments, San Diego, Calif.

[21] Appl. No.: 813,742

[22] Filed: Mar. 7, 1997

[51] Int. Cl.$^6$ ...................................................... G01C 9/02
[52] U.S. Cl. ........................................... 356/354; 356/124
[58] Field of Search ..................................... 356/354, 355, 356/345, 353, 124

[56] References Cited

U.S. PATENT DOCUMENTS

| | | |
|---|---|---|
| 4,861,148 | 8/1989 | Sato et al. . |
| 5,136,413 | 8/1992 | MacDonald et al. . |
| 5,285,236 | 2/1994 | Jain . |
| 5,386,319 | 1/1995 | Whitney . |
| 5,392,119 | 2/1995 | McArthur et al. . |
| 5,501,925 | 3/1996 | Smith et al. . |
| 5,509,553 | 4/1996 | Hunter, Jr. et al. . |
| 5,514,618 | 5/1996 | Hunter, Jr. et al. . |
| 5,538,817 | 7/1996 | Smith et al. . |
| 5,640,233 | 6/1997 | McArthur et al. ...................... 356/124 |

OTHER PUBLICATIONS

"Accuracy of Overlay Measurements: Tool and Mark Asymmetry Effects," A. Starikov, et al., Optical Engineering, Jun. 1992, vol. 31, No. 6, pp. 1298–1309.
"Binary Optics Technology: The Theory and Design of Multi–Level Diffractive Optical Elements," Swanson, G.J. (Group 52), Technical Report 854, Aug. 14, 1989.
"Wave–front Reconstruction for Compensated Imaging," Hudgin, R., J.Opt.Soc.Am., vol. 67, No. 3, Mar. 1977, pp. 375–378.
"Optimal Wave–front Estimation," Hudgin, R., J.Opt.Soc.Am., vol. 67, No. 3, Mar. 1977, pp. 378–382.
"Least–Squares Phase Estimation from the Phase Difference," Takajo, H. and Takahashi, T., J.Opt.Soc.Am., vol. 5, No. 3, Mar. 1988, pp. 416–425.
"Least–Squares Wave Front Errors of Minimum Norm," Herrmann, J., J.Opt.Soc.Am., vol. 70, No. 1, Jan. 1980, pp. 28–32.
"Least–Square Fitting a Wave–Front Distortion Estimate to an Array of Phase–Difference Measurements," Fried, D., J.Opt.Soc.Am., vol. 67, No. 3, Mar. 1977, pp. 370–375.

(List continued on next page.)

*Primary Examiner*—Samuel A. Turner
*Attorney, Agent, or Firm*—Townsend and Townsend and Crew

[57] ABSTRACT

A reticle consisting of a multiplicity of small openings corresponding to separate and distinguishable points is put in the reticle plane. This reticle is imaged down through an opening O in aperture plate AP. A corresponding multiplicity of spots are created at the image plane of the optical system. These spots have spot centroids relative to the original separate and distinguishable points in the reticle. These points, however, are deviated from their diffraction limited positions by the average of grad $\phi(u)$) over the corresponding ray bundle. The opening O in the aperture plate samples a discrete portion of the entrance pupil. With points spread out over an area of size 2*NAo*za, ray bundles with chief rays covering the entire entrance pupil will be projected down to image plane IP. The above outlined procedure is extended to analyzing the wavefront at a multiplicity of field points over the entire lens train. The process includes using an aperture plate AP consisting of a multiplicity of openings O. Each opening O is centered underneath a neighborhood of points that is accepted into the entrance pupil of the imaging objective. Points passing through all openings O will produce in the wafer plane a number of spot arrays corresponding to the number of openings O. The totality of all the arrays of spots whose centroids can be measured and reconstructed yields an aberrated wavefront $\phi(u;x)$ at a number of discrete field points x.

9 Claims, 7 Drawing Sheets

OTHER PUBLICATIONS

"Noniterative Method for Obtaining the Exact Solution for the Normal Equation in Least–Squares Phase Estimation from the Phase Difference," Takajo, H. and Takahashi, T., J.Opt.Soc.Am., vol. 5, No. 11, Nov. 1989, pp. 1818–1827.

"Wave–Front Estimation from Wave–Front Slope Measurements," Southwell, W.H., J.Opt.Soc.Am., vol. 70, No. 8, Aug. 1980, pp. 998–1006.

"Optimal Wave–Front Correction using Slope Measurements," Wallner, E., J.Opt.Soc.Am., vol. 73, No. 12, Dec. 1983, pp. 1771–1775.

"Hubble Space Telescope Prescription Retrieval," Redding, D. et al., Applied Optics, vol. 32, No. 10, 1 Apr. 1993, pp. 1728–1736.

"Hubble Space Telescope Characterized by Using Phase–Retrieval Algorithms," Fienup, J.R., et al., Applied Optics, vol. 32, No. 10, 1 Apr. 1993, pp. 1747–1767.

"Phase–Retrieval Algorithms for a Complicated Optical System," Fienup, J.R., Applied Optics, vol. 32, No. 10, 1 Apr. 1993, pp. 1747–1767.

"Effects of Higher–Order Aberrations on the Process Window," Gortych, J.E. and Williamson, D., SPIE vol. 1463 Optical/Laser Microlithography IV (1991) pp. 368–381.

"Identifying and Monitoring Effects of Lens Aberrations in Projection Printing," Toh, Kenny and Neureuther, Andrew, SPIE vol. 772 Optical Microlithography VI (1987) pp. 202–209.

"Asymptotic Behavior of the Response Function of Optical Systems," Ogura, I., J.Opt.Soc.Am., vol. 48, No. 8, Aug. 1958, pp. 38–39.

"The Diffraction Theory of Optical Aberrations, Part 1" Nijnoer, B.R.A., 1943 Elsevier Science Publishers, B.V., The Netherlands, pp. 308–314. (Reprinted from Physica, vol. 10, No. 8, Oct. 1943, pp. 679–692).

"The Diffraction Theory of Optical Aberrations, Part 2" Nijnoer, B.R.A., 1947 Elsevier Science Publishers, B.V., The Netherlands, pp. 315–322. (Reprinted from Physica, vol. 13, 1947, pp. 605–620).

"The Diffraction Theory of Optical Aberrations, Part 3" Nienhuis, K. and Nijnoer, B.R.A., 1949 Elsevier Science Publishers, B.V., The Netherlands, pp. 323–332. (Reprinted from Physica, vol. 14, No. 9, Jan. 1949, pp. 590–608).

"Zernike Annular Polynomials for Imaging Systems with Annular Pupils," Mahajan, V., 1981 Optical Society of America, pp. 342–352.

"Wave–Front Interpretation with Zernike Polynomials," Wang, J.Y. and Silva, D.E., 1980 Optical Society of America, pp. 400–408.

"Transfer Function for an Annular Aperture," O'Neill, E., pp. 517–520, Reprinted from the Journal of the Optical Society of America, vol. 46, No. 4, pp. 285–288 (Apr. 1956) and vol. 46, No. 12, p. 1096 (Dec. 1956).

"In–House characterization Technique for Steppers," Dusa, M. and Nicolau, D., SPIE, vol. 1088 Optical/Laser Microlithography II (1989) pp. 354–363.

"A Simple and Calibratable Method for the Determination of Optimal Focus," Gemmink, J.W., SPIE, vol. 1088 Optical/Laser Microlithography II (1989) pp. 220–230.

"Electrical Methods for Precision Stepper Column Optimization," Zych, L., et al., SPIE, vol. 633 Optical Microlithography V (1986) pp. 98–105.

"Characterization and Setup Techniques for a 5X Stepper," Brunner, T.A. and Stuber, S.M., SPIE, vol. 633 Optical Microlithography V (1986) pp. 106–112.

"Astigmatism and Field Curvature from Pin–Bars,"Kirk, J., SPIE, vol. 1463 Optical/Laser Microlithography IV (1991) pp. 282–291.

"A Novel High–Resolution Large–Field Scan–And–Repeat Projection Lithography System," Jain, K., SPIE, vol. 1463 Optical/Laser Microlithography IV (1991) pp. 666–677.

"Multispot Scanning Exposure System for Excimer Laser Stepper," Yoshitake, Y., et al., SPIE, vol. 1463 Optical/Laser Microlithography IV (1991) pp. 678–687.

"A New Family of 1:1 Catadioptric Broadband Deep UV High NA Lithography Lenses," Yudong, Z., et al., SPIE, vol. 1463 Optical/Laser Microlithography IV (1991) pp. 688–694.

"New I–Line Lens for Half–Micron Lithography," Takahashi, K., et al., SPIE, vol. 1463 Optical/Laser Microlithography IV (1991) pp. 696–708.

"New 0.54 Aperture I–Line Wafer Stepper with Field by Field Leveling Combined with Global Alignment," van den Brink, M.A., et al., SPIE, vol. 1463 Optical/Laser Microlithography IV (1991) pp. 709–724.

"New I–Line and Deep–UV Optical Wafer Steppers," Unger, R. and DiSessa, P., SPIE, vol. 1463 Optical/Laser Microlithography IV (1991) pp. 725–742.

"A Two–Dimensional High–Resolution Stepper Image Monitor," Pfau, A.K., et al., SPIE, vol. 1674 Optical/Laser Microlithography V (1992) pp. 182–192.

"A New Mask Evaluation Tool, the Microlithography Simulation Microscope Aerial Image Measurement System," Budd, R.A., SPIE, vol. 2197, pp. 530–540.

"Quantitive Stepper Metrology Using the Focus Monitor Test Mask," Brunner, T.A., et al., SPIE, vol. 2197, pp. 541–549.

"Analyzing Deep–UV Lens Aberrations Using Aerial Image and Latent Image Metrologies," Raab, E.L., SPIE, vol. 2197, pp. 550–565.

"Scattered Light in Photolithographic Lens," Kirk, J.P., SPIE, vol. 2197, pp. 566–572.

"Application of the Aerial Image Measurement System (AIMS™) to the Analysis of Binary Mask Imaging and Resolution Enhancement Techniques," Martino, R., et al., SPIE, vol. 2197, pp. 573–584.

"Aerial Image Measurements on a Commercial Stepper," Fields, C.H., et al., SPIE, vol. 2197, pp. 585–595.

"Latent Image Metrology for Production Wafer Steppers," Dirksen, P., et al., SPIE, vol. 2440, pp. 701–711.

"In–Situ Optimization of an I–Line Optical Projection Lens," Huang, C., SPIE, vol. 2440, pp. 734–742.

"A Dual–Wavelength Interferometer for Testing Projection Lenses," Freischald, K. and Chunsheng. H., SPIE, vol. 2440, pp. 743–748.

"Hartmann and Other Screen Tests," Ghozeil, I., Optical Shop Testing, Second Edition, Chapter 10 (1992) pp. 367–396.

"Star Tests," Welford, W.T., Optical Shop Testing, Second Edition, Chapter 11 (1992) pp. 397–426.

"Lithographic Lens Testing: Analysis of Measured Aerial Images, Interferometric Data and Photoresist Measurements" Flagello, Donis and Geh, Bernd, SPIE, vol. 2726, pp. 788–798.

"Aberration Analysis in Aerial Images Formed by Lithographic Lenses," Freitag, W., Applied Optics, vol. 31, No. 13, May 1992, pp. 2284–2290.

APPARATUS, METHOD OF MEASUREMENT, AND METHOD OF DATA ANALYSIS FOR CORRECTION OF OPTICAL SYSTEM

An apparatus, method of measurement and method of data analysis is described for determining the state of correction of an optical projection system. It produces interferometric measurements of an imaging objective that are taken in-situ and without any significant alteration of the optical or mechanical setup. As such, it can be used to monitor and assess the wavefront at a plurality of field points with only brief interruptions of the optical tool's productive time. The invention or its modifications as described can be used with photolithographic step and repeat reduction or non-reducing imaging systems (steppers), scanning imaging systems, fixed field step and repeat ablation systems, scanning ablation systems, or any other projection imaging or ablation system having large numbers of field points.

BACKGROUND OF THE INVENTION

Methods of improving the performance of existing and future steppers have a large impact on the economics of microchip and flat panel display production. The ability to improve projection imaging systems through minimally intrusive retrofitting has been done using the techniques of McArthur et al U.S. patent entitled Plate Correction of Imaging Systems, U.S. Pat. No. 5,392,119 issued 21 Feb. 1995; McArthur et al U.S. patent application entitled Improved Plate Correction Technique for Imaging Systems, Ser. No. 08/592,703 filed 26 Jan. 1962; McArthur et al U.S. patent application entitled Single Plate Corrector for Stepper Lens Train filed concurrently herewith; and Macdonald et al U.S. patent application entitled Imaging and Illumination System with Aspherization and Aberration Correction by Phase Steps, now U.S. Pat. No. 5,136,413 issued 4 Aug. 1992.

A key part of retrofitting projection imaging systems is quickly and reproducibly monitoring their state of optical correction. In the above references, distortion and field curvature data from exposed images are interferred and used to design figured optical surfaces that are placed between the top lens and the reticle plane. Distortion and field curvature correspond to the lowest order aberrations of an imaging system, namely field dependent tilt and focus. Methods for their in-situ measurement are described in M. Dusa, D. Nicolau, In-house Characterization Technique for Steppers published in Optical/Laser Microlithography II (1989), SPIE Vol. 1088, p. 354, 1989; and D. Flagello, B. Geh entitled Lithographic Lens Testing: Analysis of Measured Aerial Images, Interferometric Data and Photoresist Measurements, SPIE Vol. 2726, p. 788 of 19 Jun. 1990.

In order to ascertain the degree of correction and method of correction for higher order aberrations, more data is necessary than distortion and field curvature.

The application of a conventional interferometer to a projection imaging system can provide high quality wavefront data (see also W. Freitag, W. Grossmann, U. Grunewald entitled Aberration Analysis in Aerial Images formed by Lithographic Lenses, Applied Optics, Vol. 31, No. 13, p. 2284, 1 May 1992).

However, conventional interferometers require removing or significantly altering or disturbing the lens column. The act of removing the lens column could well introduce uncertainties into the measurement and require significant downtime from productive operation. Therefore, in the prior art we find in-situ techniques for determining, distortion, field curvature, best focus, astigmatism, and the aerial image (M. Dusa, D. Nicolau, In-house Characterization Technique for Steppers, Optical/Laser Microlithography II (1989), SPIE Vol. 1088, p. 354, 1989; L. Zych, G. Spadini, T. Hasan, B. Arden entitled Electrical Methods for Precision Stepper Column Optimization, Optical Microlithography V (1986), SPIE Vol. 663, p. 98, 1986; T. Brunner, S. Stuber entitled Characterization and Setup Techniques for a 5X Stepper Optical/Laser Microlithography V (1986), SPIE Vol. 663, p. 106, 1986; J. Kirk entitled Astigmatism and Field Curvature from Pin-Bars, Optical/Laser Microlithography IV, SPIE Vol. 1463, p. 282, 6 Mar. 1991; A. Pfau, R. Hsu, W. Oldham entitled A Two-Dimensional High-Resolution Stepper Image Monitor, Optical/Laser Microlithography V, SPIE Vol. 1674, p. 182, 11 Mar. 1992; E. Raab, C. Pierrat, C. Fields, R. Kostelak, W. Oldham, S. Vaidya entitled Analyzing the Deep-UV Lens Aberrations Using Aerial Image and Latent Image Metrologies, Optical/Laser Microlithography VII, SPIE Vol. 2197, p. 550, 2 Mar. 1994; C. Fields, W. Partlo, W. Oldham entitled Aerial Image Measurements on a Commercial Stepper, Optical/Laser Microlithography VII, SPIE Vol. 2197, p. 585, 2 March 1994; C. Huang entitled In-situ Optimization of an i-line Optical Projection Lens, Optical/Laser Microlithography VIII, SPIE Vol. 2440, p. 735, 22 Feb. 1995).

The greatest amount of information is provided by in-situ aerial image measurements. However the light level is generally low, leading to long exposure times or poor signal-to-noise ratios. The reconstruction of the aberrated wavefront is ambiguous unless several out-of-focus exposures are done (see D. Redding, P. Dumont, J. Yu, Hubble Space Telescope Prescription Retrieval, Applied Optics, Vol. 32, No. 10, p. 1728, 1 Apr. 1993; J. Fienup, J. Marron, T. Schulz, J. Seldin, Hubble Space Telescope Characterized by Using Phase-Retrieval Algorithms, Applied Optics, Vol. 32, No. 10, p. 1747, 1 Apr. 1993; J. Fineup entitled Phase-Retrieval Algorithms for a Complicated Optical System, Applied Optics, Vol. 32, No. 10, p. 1737, 1 Apr. 1993).

The ideal solution would minimize the intrusion, preserve the lens column and stepper environment, and be quick to perform. It could be utilized to rapidly characterize multiple steppers, as well as perform temporal, barometric, thermal and other environmental characterizations. The device should be a stand-alone, portable unit, that would determine wavefront as a function of imaging field position for all conceivable aberrations of the stepper.

The data generated using such an in-situ wavefront interferometer can be used to help determine opportunities for lens correction. In addition, the output could be utilized in commercially available software programs such as PROLITH and used for photolithography process modeling.

SUMMARY OF THE INVENTION

A reticle consisting of a multiplicity of small openings corresponding to separate and distinguishable points is put in the reticle plane. This reticle is imaged down through an opening O in aperture plate AP. A corresponding multiplicity of spots are created at the image plane of the optical system. These spots have spot centroids relative to the orginal separate and distinguishable points in the reticle. These points, however, are deviated from their diffraction limited positions by the average of grad $\phi(u)$) over the corresponding ray bundle. The opening O in the aperture plate samples a discrete portion of the entrance pupil. With points spread out over an area of size $2*NA_o*za$, ray bundles with chief rays covering the entire entrance pupil will be projected down to image plane IP. Here, NAo is the numerical aperture of the imaging objective on the object side or, equivalently, the numerical aperture of the entrance pupil, and za is the separation between the aperture plate plane and the reticle plane.

Measuring the deviations of the centroids from their ideal position, we then have average values of grad $\phi(u)$) sampled over the entrance pupil. Once this measurement of deviations is made, it is possible to reconstruct the aberrated wavefront corresponding to a neighborhood of points in the reticle plane that passed through the opening O in the aperture plate. Assuming that the aberrated wavefront is isoplanatic over this small neighborhood of points, we can identify the reconstructed wavefront $\phi(u)$ with a single field point position (x,y). (x,y) is just the average value of the transverse positions of the neighborhood of openings in the reticle.

The above outlined procedure is extended to analyzing the wavefront at a multiplicity of field points over the entire imaging objective field of view. The process includes using an aperture plate AP consisting of a multiplicity of openings O. Each opening O is centered underneath a neighborhood of points that is accepted into the entrance pupil of the imaging objective. Points passing through all openings O will produce in the wafer plane a number of spot arrays corresponding to the number of openings O. The totality of all the arrays of spots whose centroids can be measured and reconstructed yield an aberrated wavefront $\phi(u;x)$ at a number of discrete field points x.

DESCRIPTION OF THE PREFERRED EMBODIMENT

Outline of the General Theory

In a perfect optical system, a point source located in the object or reticle plane of the system sends a diverging or expanding spherical wavefront towards the imaging objective, which then converts it into a converging or contracting spherical wave with center of curvature located in the image or wafer plane. This converging spherical wave then focuses down to a diffraction limited spot, a spot whose size is determined by the wavelength of light and the numerical aperture (NA) of the converging wavefront. In practice, the converging wavefront is not a perfect sphere but deviates from it, and the resulting spot in the image plane is larger than a diffraction limited one.

Figure 2:
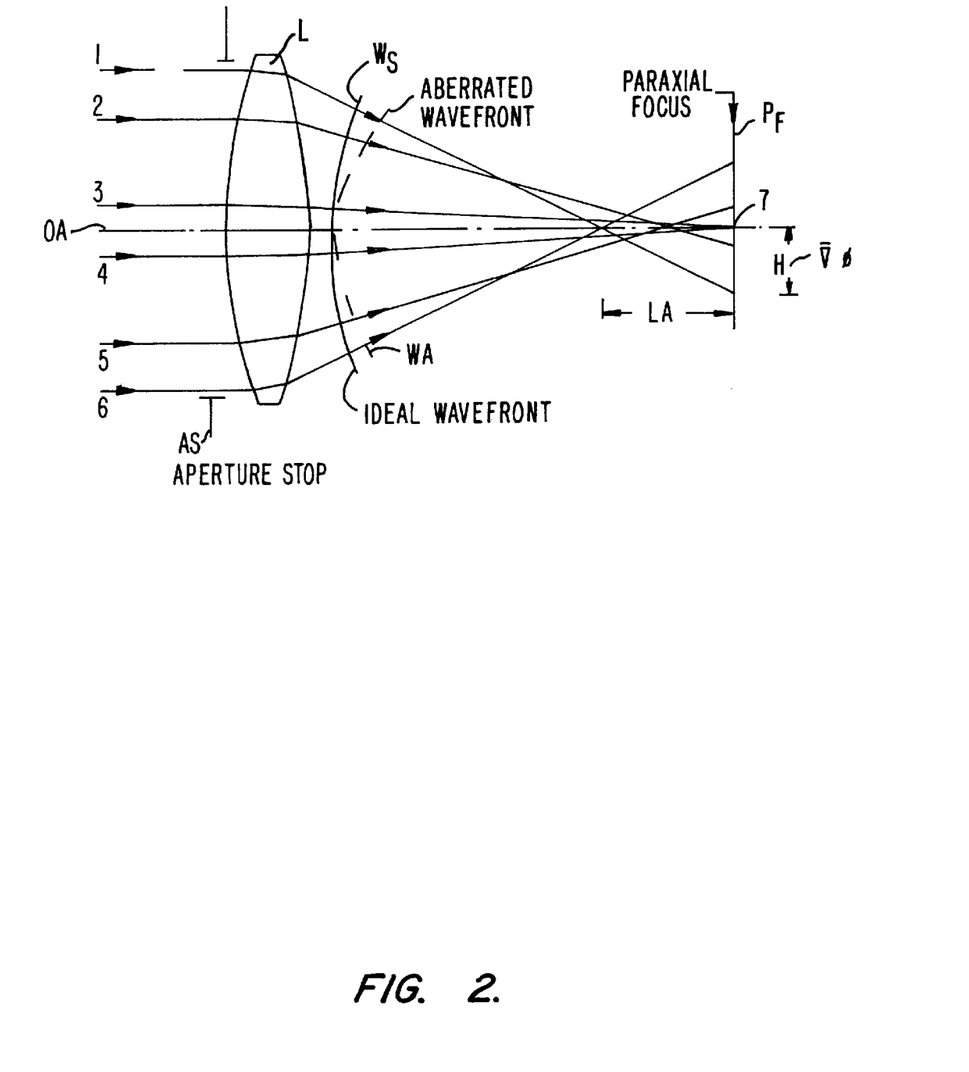
FIG. 2 illustrates a ray bundle suffering from spherical aberration.

FIG. 2 illustrates converging lens L, which is part of an larger, undrawn imaging system. Rays from a point in the object plane (not shown) pass through aperture stop AS, lens L and are never confluent upon a single image point as they pass beyond lens L. Edge rays 1 and 6 focus distance LA from the paraxial focal plane and spread out to radius H at the paraxial focal plane $P_F$. The best focal plane is located at the plane with the smallest blur circle. Ray trajectories corresponding to ideal spherical wavefront $W_S$ would focus at point 7. The present abberated wavefront $W_A$ deviates from this sphere. The ray trajectories are normal to the wavefront surface.

Displacement or radius H is proportional to the gradient of the aberrated wavefront $\phi(u)$, or H~grad($\phi(u)$), where u is the position or angle of the ray at the aperture stop AS and grad is the 2-dimensional gradient operator. Thus, measuring the vector displacements (dx,dy) of a selection of rays, 1,2,3,4,5,6, gives us the derivatives or gradient of the wavefront $\phi(u)$. Given the wavefront gradients, or wavefront gradients averaged over regions of the aperture stop, there are a number of techniques for reconstructing the wavefront or the Zernikie or polynomial moments of the wavefront. These techniques first involve formulating the wavefront reconstruction as an overdetermined set of linear equations. Next, these equations are solved using mathematical techniques such as normal equation solution, damped least squares, or singular value decomposition. References discussing both formulation and solution of the problem include R. Hudgin entitled Wave-front Reconstruction for Compensated Imaging, Journal of the Optical Society of America, Vol. 67, No. 3, p. 375, March 1977; R. Hudgin entitled Optimal Wave-Front Estimation, Journal of the Optical Society of America, Vol. 67, No. 3, p. 378, March 1977; H. Takajo, T. Takahashi entitled Least-Squares Phase Estimation from the Phase Difference, Journal of the Optical Society of America, Vol. 5, No. 3, p. 416, March 1988; J. Herrmann entitled Least-Squares Wave Front Errors of Minimum Norm, Journal of the Optical Society of America, Vol. 70, No. 1, p. 28, January 1980; D. Fried entitled Least-Square Fitting a Wave-Front Distortion Estimate to an Array of Phase-Difference Measurements, Journal of the Optical Society of America, Vol. 67, No. 3, p. 370, March 1977; H. Takajo, T. Takahashi entitled Noniterative Method for Obtaining the Exact Solution for the Normal Equation in Least-Squares Phase Estimation from the Phase Difference, Journal of the Optical Society of America, Vol. 5, No. 11, p. 1818, November 1988; W. H. Southwell entitled Wave-Front Estimation from Wave-Front Slope Measurements, Journal of the Optical Society of America, Vol. 70, No. 8, p. 998, August 1980; E. P. Wallner entitled Optimal Wave-Front Correction Using Slope Measurements, Journal of the Optical Society of America, Vol. 73, No. 12, p. 1771, December 1983.

Therefore if the displacements, H, can be measured, a wavefront reconstruction will yield the aberrated wavefront $\phi(u)$.

Figure 3:
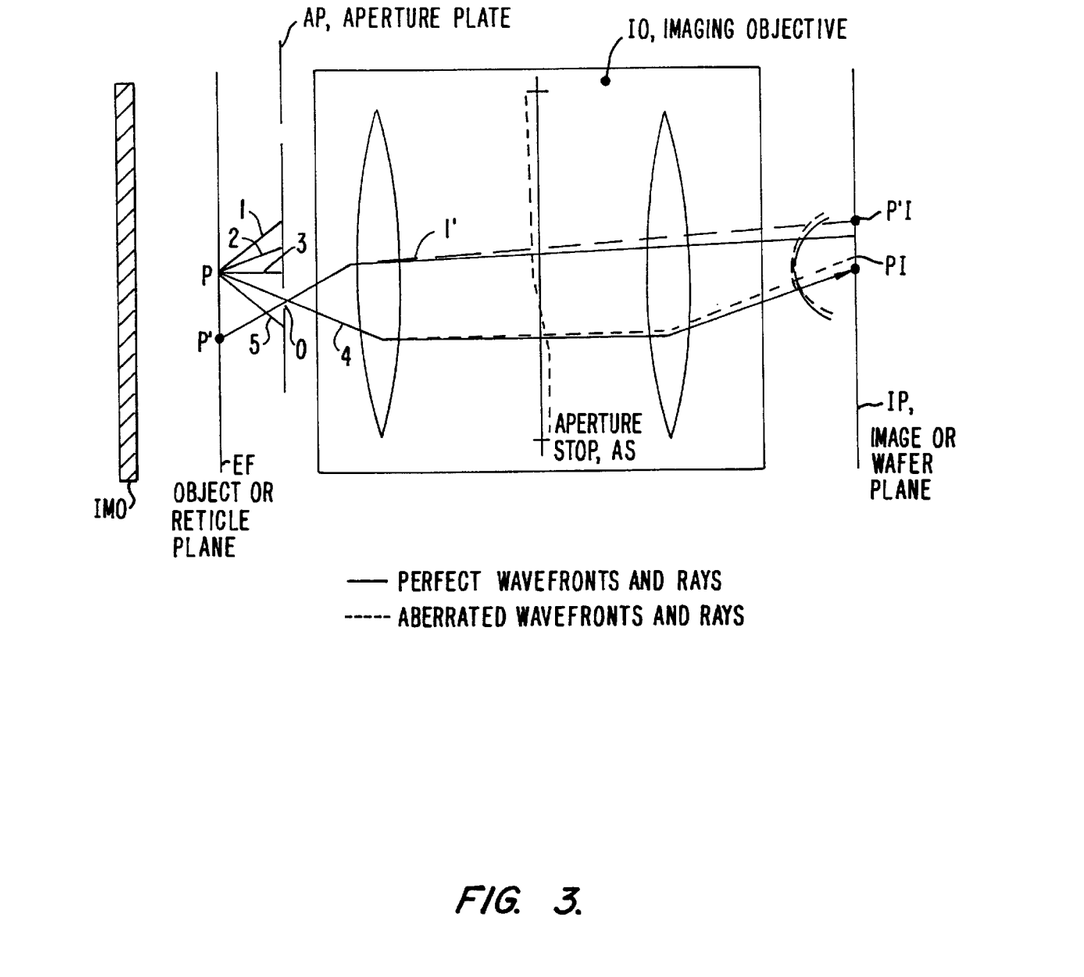
FIG. 3 outlines the functioning of this invention.

FIG. 3 schematically illustrates how information about the displacements H~grad($\phi(u)$) is obtainable. Point P in the reticle plane has aperture plate AP interposed between it and the first element of the optical system. Of the rays 1, 2, 3, 4, 5 emitted from P, only ray 4 passes through opening O in aperture plate AP and is transmitted by imaging objective IO and projected onto a wafer in image plane IP. Aberrations of imaging objective IO cause ray 4 to deviate from the path an unaberrated image objective IO would produce (drawn as a solid line), follow a different path (dashed line), and intersect the wafer at transverse position PI differing from the ideal one by an amount proportional to grad($\phi(u)$). Nearby point P' has only a small bundle of rays centered on ray 1' passing through aperture O in aperture plate AP, through imaging objective IO, and intersecting wafer in image plane IP at point P'I. The deviation of ray 1' from its ideal imaging point is also proportional to grad($\phi(u')$), u' being the angle or position of ray 1' as it passes through the aperture stop AS (see solid line (unaberrated) and broken line (abberated)).

In FIG. 2, all of the incident rays 1,2,3,4,5,6 arise from the same object point and there is no aperture plate present, so the projected image consists of a single, diffuse smear that when developed on photoresist provides only some information as to the average size of the magnitude of grad($\phi$(u)). In FIG. 3, the ray bundle centered on ray 1 and passing through O creates a spot in plane IP whose centroid is deviated from its ideal position by the average value of grad($\phi$(u)) for this ray bundle. The ray bundle centered on ray 1' and passing through O similarly creates a spot in plane IP whose centroid is deviated from its ideal position by the average value of grad($\phi$(u)) for this ray bundle. For sufficiently separated points P, P' their corresponding projected spots PI, P'I are separated by virtue of originating from separate and distinguishable points P, P' in the reticle plane.

Now if instead of just two points, a reticle consisting of a multiplicity of small openings corresponding to separate and distinguishable points is put in the reticle plane and imaged down through opening O in aperture plate AP, a corresponding multiplicity of spots are created whose spot centroids are deviated from their positions by the average of grad($\phi$(u)) over the corresponding ray bundle. With points spread out over an area of size 2*NAo*za, ray bundles with chief rays covering the entire entrance pupil will be projected down to image plane IP. Here, NAo is the numerical aperture of the imaging objective on the object side or, equivalently, the numerical aperture of the entrance pupil, and za is the separation between the aperture plate plane and the reticle plane.

Measuring the deviations of the centroids from their ideal position, we then have average values of grad($\phi$(u)) sampled over the entrance pupil and can reconstruct the aberrated wavefront corresponding to a neighborhood of points in the reticle plane. Assuming that the aberrated wavefront is isoplanatic over this small neighborhood of points, we can identify the reconstructed wavefront $\phi$(u) with a single field point position (x,y). (x,y) is just the average value of the transverse positions of the neighborhood of openings in the reticle.

The above outlined procedure is extended to analyzing the wavefront at a multiplicity of field points. Using an aperture plate AP consisting of a multiplicity of openings such as O, with each opening being centered underneath a neighborhood of points that are accepted into the entrance pupil of the imaging objective, will produce in the wafer plane an array of spots whose centroids can be measured and reconstructed to yield an aberrated wavefront $\phi$(u;x) at a number of discrete field points x.

Depending on the illumination conditions present at the reticle plane, not all of the acceptance cone of the entrance will be filled. This is compensated for by utilizing an imaging matching optic, IMO, that precedes the reticle plane and alters the incident illumination so that the entire entrance pupil is filled.

Illumination Matching Optic

Figure 1A:
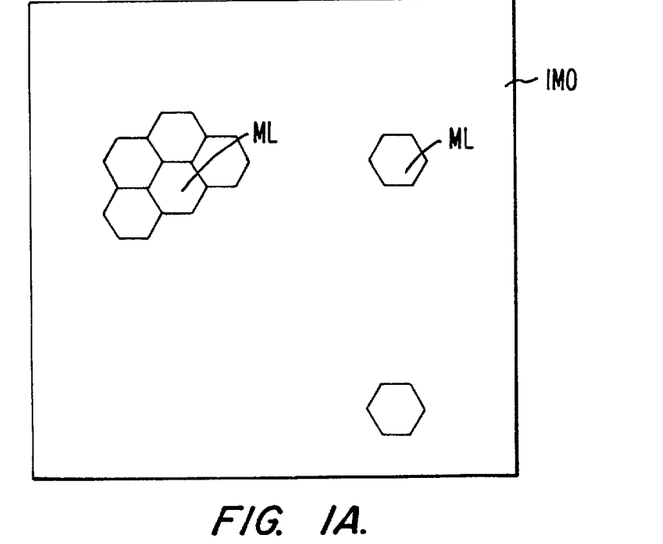
FIGS. 1a, 1b and 1c are plan side and bottom views of the interferometer head.
Figure 1B:
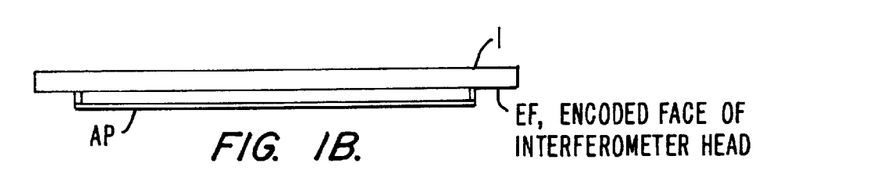
Figure 1C:
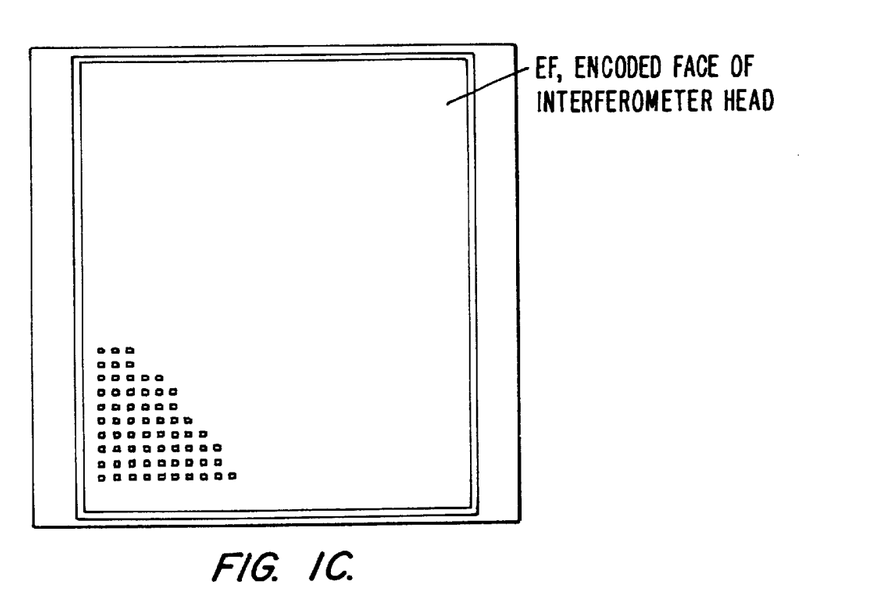

FIGS. 1a, 1b and 1c illustrate the preferred embodiment of the interferometer head in top, side and bottom views respectively. The top side (FIG. 1a) shows the illumination matching optic, IMO, consisting of an array of hexagonally packed microlenses ML. Their purpose is to increase the diversity of ray angles impinging on the encoded face, EF, so that it is uniform over the imaging objective numerical aperture on the object or reticle side, NAo. A number of arrangements are possible some of which are a diffuser plate with complete or limited scattering range, microlens arrays in square or hexagonal geometries, scattering structures located on the encoded face, or a combination of lens arrays and diffusers to both decrease exposure time and simultaneously achieve angular diversity.

Encoded Face

Figure 4:
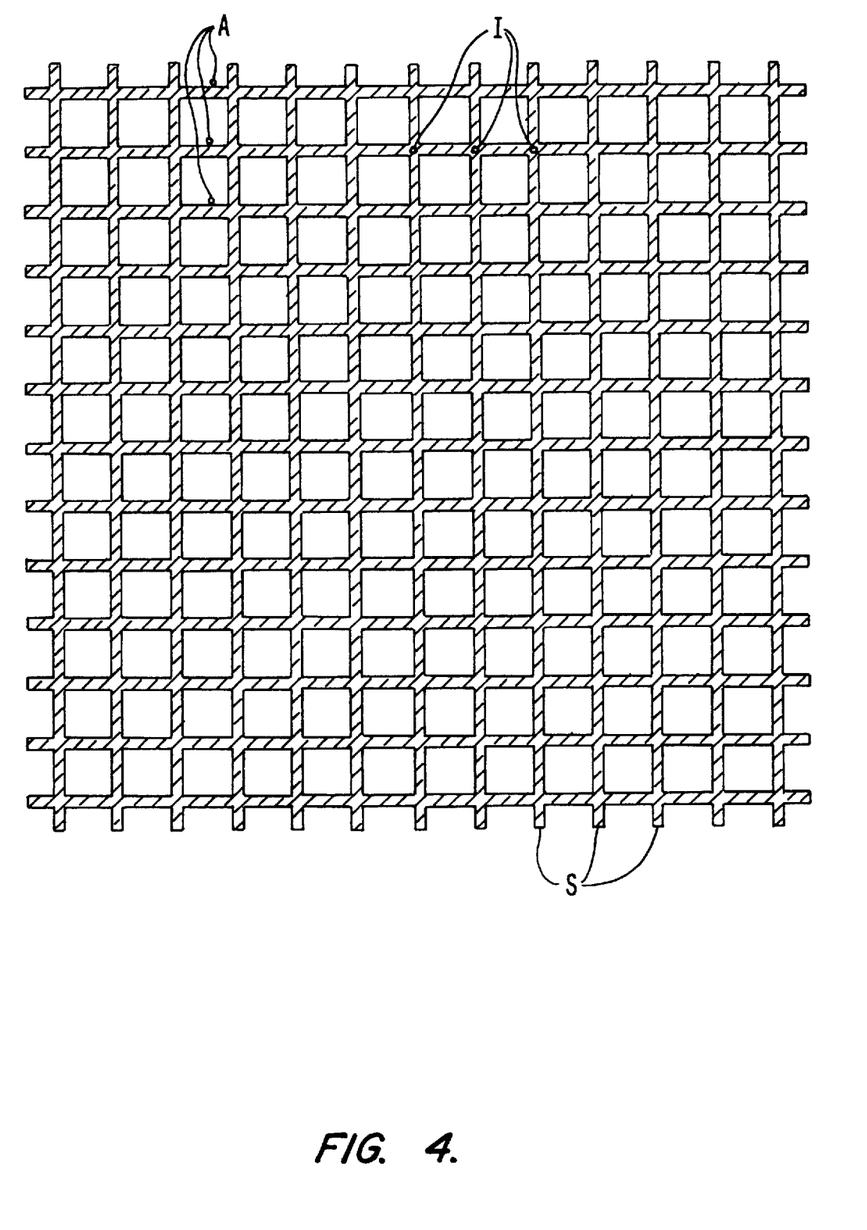
FIG. 4 illustrates an exemplary pattern on the encoded face.

The encoded face, EF, consists of a series of patterns, one for each field point, consisting of a regular array of streets and alleys, S and A, that define intersections I as shown in FIG. 4. The exact number of field points that can be interrogated will depend on details of the imaging system, but for a typical I-line projection stepper, hundreds to thousands of field points can be interrogated. Thus on an ASM/100 stepper over 500 field points are easily accommodated with greater than 10,000 being possible. This regular array, when projected through an opening O in aperture plate AP, is modified in two notable ways.

First, since the pattern of FIG. 4 has been chosen so that its angular extent as measured from the center of opening O is larger than NAo, the overall projected pattern will have its extent determined by the shape and size of the entrance pupil. Thus, for a circular entrance pupil, the overall square pattern of FIG. 4 will be projected down to an overall circular one, FIG. 5, of size=2*za*NAo/M, the missing corners and edges being blocked at the system aperture stop AS. Thus a circularly obscured entrance pupil would produce a similarly circularly obscured pattern at the wafer plane.

For a typical I-line projection system such as the ASM/100 we would have:

| | |
|---|---|
| za = encoded face to aperture plate distance | = 5 mm |
| NAo = numerical aperture on the object side | = 0.11 |
| M = imaging reduction ratio | = 5 |
| size of projected pattern = 2*za*NAo/M | = 0.22 mm |
| P = pitch between adjacent projected patterns | = 1 mm |

There is one set of waffle iron patterns for each field point we are measuring.

Second, it is important to note its deviation in accordance with the wavefront aberration. The intersections, I, of the streets and alleys on the encoded face, EF, are precisely made in a regular array or if imprecisely made will have had their positions precisely measured so that in either case their positions on EF are precisely known. Intersections I upon being projected onto the wafer plane through the aperture plate and imaging objective form a corresponding array of intersections I'. The deviation of these spots is related to the wavefront gradients as follows:

$$(dx, dy) = \frac{\lambda}{2 \pi NA} * \frac{\int d^2n \, W(n) * \nabla(\phi(n))}{\int d^2n \, W(n)} \quad (1)$$

l=wavelength of light
NA=numerical aperture on the image side
n=vector indicating relative ray position at aperture stop
W(n)=1 over the portion of the aperture stop ray bundle passed through
=0 otherwise.

In the preferred embodiment, the encoded face consists of an array of gridlike or street and alley openings with one set of openings for each interrogated field point. This choice is mainly dictated by the ability of high precision optical metrology tools such as the Nikon 5I to accurately measure intersections of lines at right angles. Using other tools, different patterns would be more advantageous. Thus for an electron beam based metrology tool or different optical metrology tools, circular or square dots might be better suited for precise measurement. Another pattern might be made from streets and alleys that do not intersect but are transversely displaced and measured separately. Yet another pattern might consist of the marks used by a stepper or projection imaging system with accurate location subsystem; it could even be marks used by the very same system under test.

In another version, since the entrance pupil naturally limits the imaging field of view passing through each aperture, the entire encoded face could contain without interruption a suitable pattern, such as dots or grid lines.

In another variation, the function of the illumination matching optic can be incorporated in whole or in part on the encoded face.

The projected pattern could be made in reverse contrast from that shown. It could be manufactured using e-beam lithography, or a photowriter. It can be reproduced using contact printing.

Aperture Plate

The openings in aperture plate AP are typically circular in shape. Their size is determined by the desired resolution of the wavefront reconstruction, smaller sizes corresponding to greater transverse resolution. Their angular size is given by:

$$\tan(NAa) = Ra/za$$

where the preceding symbols take on the following meanings and typical values:

| | |
|---|---|
| NAa = half angle subtended by aperture opening | = 0.01 rad |
| Ra = radius of opening O in aperture plate | = 0.05 mm |
| za = encoded face to aperture plate distance | = 5 mm |

The transverse resolution determines the number of modes or Zernikie polynomials that can be well determined as: $Nz \sim 0.5*(NAo/NAa)^2 = 60$ for the exemplary numbers already cited.

Figure 6:
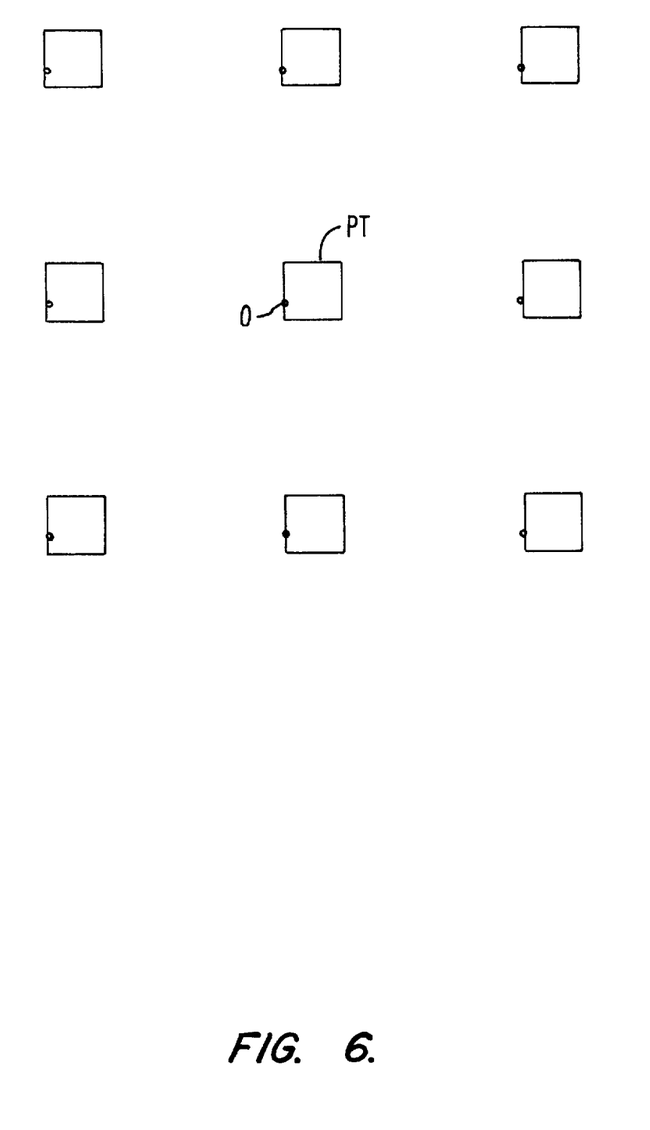
FIG. 6 shows part of the aperture plate and encoded head in plan view.

Referring to FIG. 6, the nominal transverse location of aperture opening O is the center of the chief ray passing through the center of the pattern PT and the center of the aperture stop AS. For an imaging objective telecentric on the object side, the transverse centers of PT and O would coincide; FIG. 6 depicts the general, non-telecentric case. To interpret the projected images with maximum accuracy, the relative transverse positions of patterns PT and apertures O must be precisely set or at least known. To this end, apertures O are preferably fabricated with high (<1 micron) accuracy using contact printing, direct write or NC controlled machine tools. Alternatively, the plate could be fabricated and the relative positions measured with sufficient accuracy, these measurements later being used in the aberrated wavefront reconstruction process. Even if the openings in the plate are accurately made, due to variances from stepper to stepper in the nontelecentricity or the exact position of the reticle/aperture plate combination, the chief ray from the center of pattern PT will not always line up with the center of aperture O.

Figure 5:
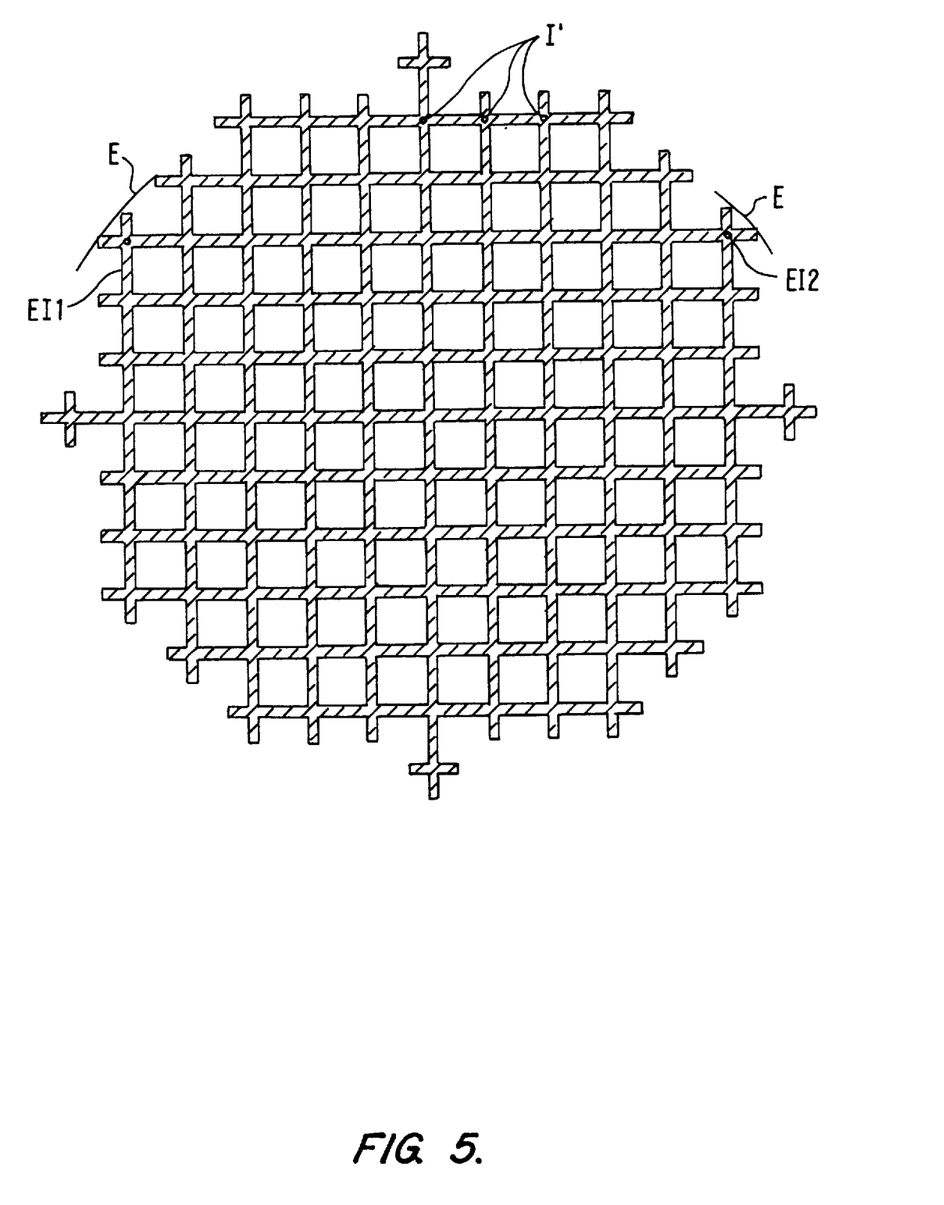
FIG. 5 is a projection onto a wafer of FIG. 4.

There are several methods to ascertain the transverse position of apertures O with respect to the centers of patterns PT. Referring to FIG. 5, the projected pattern is nominally centered on the circle defined by the entrance pupil of the imaging objective. If aperture O were transversely shifted, the edge intersections EI1 and EI2 would be offset by different amounts from projected edge of the entrance pupil, E. Indeed, any set of well-defined points in the projected pattern whose position is measured relative to the edge of the projected field can be used to determine the offset of aperture plate AP from the encoded face EF. Thus, if the openings O in the aperture plate have been made or measured to sufficient tolerance, the overall rotation and offset of the aperture plate relative to encoded face is determined by measuring the offset at two field points.

Figure 7:
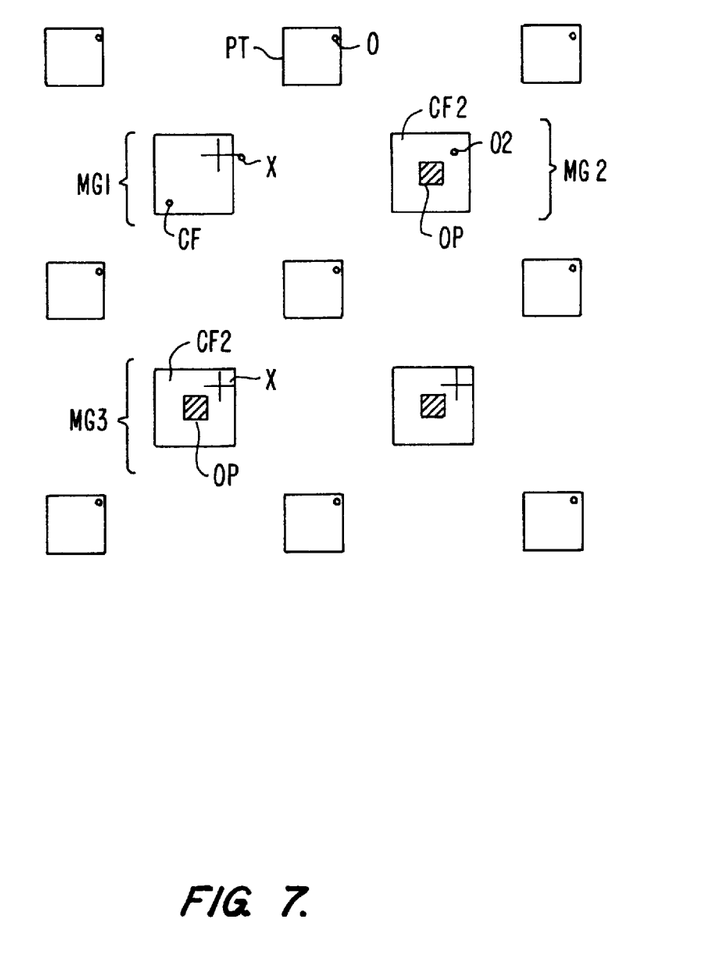
FIG. 7 shows alignment mark structures in plan view.

Alternatively, other sets of marks can be used to determine the transverse offset between aperture plate and encoded face. In FIG. 7, interspersed with the patterns, PT, and openings, O, used for determining the wavefront aberrations are mark groups MG1, MG2 and MG3 that can be used to determine the transverse alignment of the aperture plate and encoded face. Group MG1 consists of a clear field area CF in the encoded face larger than 2*NAo*za and a corresponding cross, X, in the aperture plate. When the cross is suitably sized, what prints in the reticle plane is a square with rounded corners. This mark must be used in conjunction with group MG2.

Group MG2 consists of a clear field area CF2 in the encoded face larger than 2*NAo*za with another opaque square, OP, centered on it. The corresponding feature in the aperture plate is a circular opening O2. What prints in the reticle plane is a square surrounded by a circle. The inner square corresponds to region OP, while the outer circle corresponds to the boundaries of the entrance pupil. Measuring the offset of these two projected features determines the local offset between encoded face and aperture plate. When used in conjunction with group MG1, the offset of the square with rounded corners printed by MG1 and region OP produced by MG2 can be used to determine the local offset between aperture plate and encoded face.

Group MG3 combines features of the previously described groups. The group MG3 consists of a clear field area CF2 in the encoded face larger than 2*NAo*za with another opaque square, OP, centered on it. The corresponding feature in the aperture plate is a cross shaped opening, X. What prints in the reticle plane is a square surrounded by another square with rounded corners. The inner square corresponds to region OP, while the outer circle corresponds to the boundaries of the entrance pupil. Measuring the offset of these two projected features determines the local offset between encoded face and aperture plate.

The aperture plate is typically made of thin (<0.3 mm) glass or fused silica and the apertures are either contact printed or directly written on it. The plate is then chemically milled to produce clear, through, openings. Alternatively, the glass plate can be used with openings in its chrome-coated face corresponding to the apertures, but the aberration induced by the additional glass thickness must be subtracted out from the reconstructed result so that the aberrated wavefront represents the imaging objective optical performance and does not contain measurement artifacts. If this is done, the glass thickness of the aperture is preferably measured before assembly and any variations in glass thickness used as inputs for the subtraction procedure.

Once made and characterized, the aperture plate can be contact printed to produce replicas.

Measurement of Spots

The photoexposure is typically made on chrome-coated fused silica wafers. After exposure, the plates are developed, the exposed chrome etched, and the remaining photoresist stripped. An optical metrology tool such as the Nikon Instruments 5I is used to locate the positions of the projected patterns and any reticle to plate alignment marks. Alternatively, silicon wafers having a metallic layer such as Cr, Au, or Ni overcoated with photoresist are photoexposed, developed and the exposed metal etched away. The transverse positions of the projected patterns and alignment marks are then measured with an optical metrology tool capable of working in reflected light or in an e-beam metrology tool. Another method involves measuring the positions of openings in photoresist (no metal etch step). If the accuracy is sufficient for the application, an ordinary coordinate measuring tool could be used for ascertaining the locations of the projected pattern.

Yet another technique involves the projected patterns being alignment marks that are automatically readable by the projection system's own alignment system. This last technique is particularly advantageous if used with alignment systems and photoresist that detect a latent, undeveloped image in photoresist.

Wavefront Reconstruction

The wavefront is specified as a sum of Zernikie polynomials as:

$$\phi(n) = \Sigma a_k * Z_k(n) \quad (2)$$

where the summation over the indices k and $a_k$ is the coefficient of the Zernikie polynomial $Z_k(n)$. Zernikie polynomials and their application to wavefront aberrations are described in B. Nijboer entitled The Diffraction Theory of Optical Aberrations, Part I: General Discussion of the Geometrical Aberrations, Selected Papers on Effects of Aberrations in Optical Imaging, Vol. MS 74, p. 308, 1993; B. Nijboer entitled The Diffraction Theory of Optical Aberrations, Part II: Diffraction Pattern in the Prescence of Small Aberrations, Selected Papers on Effects of Aberrations in Optical Imaging, Vol. MS 74, p. 315, 1993; K. Nienhuis, B. Nijboer entitled The Diffraction Theory of Optical Aberrations, Part III: General Fomulae for Small Aberrations: Experimental Verification of the Theoretical Results, Selected Papers on Effects of Aberrations in Optical Imaging, Vol. MS 74, p. 323, 1993; V. Mahajan entitled Zernike Annular Polynomials for Imaging Systems with Annular Pupils, Selected Papers on Effects of Aberrations in Optical Imaging, Vol. MS 74, p. 342, 1993; J. Wang, D. Silva entitled Wave-front Interpretation with Zernike Polynomials, Selected Papers on Effects of Aberrations in Optical Imaging, Vol. MS 74, p. 400, 1993. Then defining $$b_{j,k} = \frac{\int d^2n \, W(n) * \nabla(Z_k(n))}{\int d^2n \, W(n)} \quad (3)$$

we wish to minimize:

$$E = \Sigma (dx_j - \Sigma a_k * b_{j,n} a_k)^2 \quad (4)$$

where the first sum runs over j and the second over k $dx_j$ is understood to be the j'th vector measurement. W(n) as used above depends on the index j since it represents the footprint of the ray bundle emanating from point xj. Mathematically, W(n)=1 only over those regions of the entrance pupil where rays from point xj pass; elsewhere it equals zero. Other methods of formulating the problem as well as solving this class of problem are discussed in references R. Hudgin entitled Wave-front Reconstruction for Compensated Imaging, Journal of the Optical Society of America, Vol. 67, No. 3, p. 375, March 1977; R. Hudgin entitled Optimal Wave-Front Estimation, Journal of the Optical Society of America, Vol. 67, No. 3, p. 378, March 1977; H. Takajo, T. Takahashi entitled Least-Squares Phase Estimation from the Phase Difference, Journal of the Optical Society of America, Vol. 5, No. 3, p. 416, March 1988; J. Herrmann entitled Least-Squares Wave Front Errors of Minimum Norm, Journal of the Optical Society of America, Vol. 70, No. 1, p. 28, January 1980; D. Fried entitled Least-Square Fitting a Wave-Front Distortion Estimate to an Array of Phase-Difference Measurements, Journal of the Optical Society of America, Vol. 67, No. 3, p. 370, March 1977; H. Takajo, T. Takahashi entitled Noniterative Method for Obtaining the Exact Solution for the Normal Equation in Least-Squares Phase Estimation from the Phase Difference, Journal of the Optical Society of America, Vol. 5, No. 11, p. 1818, November 1988; W. H. Southwell entitled Wave-Front Estimation from Wave-Front Slope Measurements, Journal of the Optical Society of America, Vol. 70, No. 8, p. 998, August 1980; E. P. Wallner entitled Optimal Wave-Front Correction Using Slope Measurements, Journal of the Optical Society of America, Vol. 73, No. 12, p. 1771, December 1983. The preferred technique is the singular value decomposition.

Alternative Embodiments

Thus far, this invention has been largely described with reference to a combined imaging matching optic, encoded face and aperture plate that constitute a single contiguous item. The utility of this invention derives from the non-intrusive, accurate, and rapid process for collecting interferometric data. Thus we now briefly describe alternative embodiments that incorporate these essential features but have differing physical arrangements of the key elements.

One arrangement involves segmenting the elements of imaging matching optic, encoded face and aperture plate as separate objects. An advantage of this is that if the imaging system had ready accommodation for these separate attachments, a flexible and widely varying set of exposure and pattern conditions could be produced with the minimal number of discrete parts. Additionally, by segmenting these parts, the aperture plate could be placed at other locations in the beamtrain, such as directly above the wafer or at suitable or otherwise convenient locations within the imaging objective itself. The imaging matching optic could be placed at a more advantageous location within the stepper illumination subsystem. Indeed, locations for these elements could be incorporated as standard features in stepper systems.

Another arrangement uses a moveable aperture plate that shifts along with the wafer after each exposure. The recorded images are then analyzed in a similar manner.

Yet another arrangement utilizes an array of photodetectors and corresponding preamplifiers, and memory packaged into the form factor of a wafer. The wafer is loaded along with the interferometer head and exposed. To increase the sensitivity, the xy stage is dithered.

The use of this interferometer arrangement has been described in reference to its use in projection photoexposure systems such as those described in T. Sato et al U.S. Pat. No. 4,861,148 entitled Projection Optical System for Use in Precise Copy; T. Whitney U.S. Pat. No. 5,386,319 entitled High Resolution Imagery Systems and Methods issued 31 Jan. 1995; K. Jain entitled A Novel High-Resolution Large-Field Scan-and-Repeat Projection Lithography System, Optical/Laser Microlithography IV, SPIE Vol. 1463, p. 666, 6 Mar. 1991; Y. Yoshitake, Y. Oshida, T. Tanimoto, M. Tanaka, M. Yoshida, entitled Multispot Scanning Exposure System for Excimer Laser Stepper, Optical/Laser Microlithography IV, SPIE Vol. 1463, p. 678, 6 Mar. 1991; Z. Yudong, Z. Haixing, W. Zhijiang entitled A New Family of 1:1 Catadioptric Broadband Deep UV High NA Lithography Lenses, Optical/Laser Microlithography IV, SPIE Vol. 1463, p. 688, 6 Mar. 1991; K. Takahashi, M. Ohta, T. Kojima, M. Noguchi entitled New I-Line Lens for Half-Micron Lithography, Optical/Laser Microlithography IV, SPIE Vol.

1463, p. 696, 6 Mar. 1991; M. van den Brink, B. Katz, S. Wittekoek entitled New 0.54 Aperture I-line Wafer Stepper with Field by Field Leveling Combined with Global Alignment, Optical/Laser Microlithography IV, SPIE Vol. 1463, p. 709, 6 Mar. 1991; R. Unger, P. DiSessa entitled New I-Line and Deep-UV Optical Wafer Steppers, Optical/Laser Microlithography IV, SPIE Vol. 1463, p. 725, 6 Mar. 1991. Such photoexposure systems can take the form of refractive or catadioptric, fixed field step and repeat systems, slit type scanning systems, or scanning step and repeat systems. However it can equally well be used for other instruments such as projection ablation tools, scanning imaging or ablation systems, 9,13, for cameras, microscopes and most conveniently in any instrument having a readily useable recording plane.

All of the references cited herein are incorporated by reference to this specification as if set forth fully herein.

What is claimed is:

1. A method for analysis of a lens train for taking an image from a reticle plane and relaying the image to a image plane, the method comprising the steps of:

providing a reticle consisting of a multiplicity of separate and distinguishable points in the reticle plane;

providing an aperture plate at a distance from the reticle having at least one opening;

imaging at least a portion of the reticle through the at least one opening in the aperture plate to create a multiplicity of spots at the image plane, the multiplicity of spots having spot centroids relative to the separate and distinguishable points in the reticle deviated from diffraction limited positions by an average of grad $\phi(u)$) over the diffraction limited positions of the spots produced by a diffraction limited lens train.

2. A method for analysis of a lens train for taking an image from a reticle plane and relaying the image to a image plane according to claim 1, the method comprising the further step of:

the at least one opening in the aperture plate sampling a discrete portion of the lens train only.

3. A method for analysis of a lens train for taking an image from a reticle plane and relaying the image to a image plane according to claim 1, the method comprising the further step of:

the multiplicity of separate and distinguishable points being spread out over an area of size 2*NAo*za with ray bundles having chief rays covering the entire entrance pupil where NAo is the numerical aperture of the imaging objective on the object side and za is the separation between the aperture plate plane and the reticle plane.

4. A method for analysis of a lens train for taking an image from a reticle plane and relaying the image to a image plane according to claim 3, the method comprising the further step of:

the numerical aperture NAo being the aperture of the entrance pupil.

5. A method for analysis of a lens train for taking an image from a reticle plane and relaying the image to a image plane according to claim 1, the method comprising the further step of:

measuring the deviations of the centroids of the multiplicity of spots from their diffraction limited positions to obtain the average values of grad $\phi(u)$) sampled over the entrance pupil.

6. A method for analysis of a lens train for taking an image from a reticle plane and relaying the image to a image plane according to claim 5, the method comprising the further step of:

reconstructing an aberrated wavefront corresponding to the multiplicity of points in the reticle plane that passed through the at least one opening in the aperture plate.

7. A method for analysis of a lens train for taking an image from a reticle plane and relaying the image to a image plane according to claim 6, the method comprising the further step of:

identifying the reconstructed wavefront $\phi(u)$ with a single field point position (x,y).

8. A method for analysis of a lens train for taking an image from a reticle plane and relaying the image to a image plane according to claim 1, the method comprising the further step of:

analyzing the wavefront at a multiplicity of openings in the aperture plate over the entire lens train with each opening being centered underneath a neighborhood of points that is accepted into the entrance pupil of the imaging objective.

9. A method for analysis of a lens train for taking an image from a reticle plane and relaying the image to a image plane according to claim 8, the method comprising the further step of:

utilizing the totality of all the arrays of spots whose centroids can be measured and reconstructed to yield an aberrated wavefront $\phi(u;x)$ at a number of discrete field points x.

* * * * *